(12) United States Patent
Barber et al.

(10) Patent No.: US 6,787,385 B2
(45) Date of Patent: Sep. 7, 2004

(54) METHOD OF PREPARING NITROGEN CONTAINING SEMICONDUCTOR MATERIAL

(75) Inventors: Greg D. Barber, Denver, CO (US); Sarah R. Kurtz, Golden, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 10/344,380

(22) PCT Filed: May 31, 2001

(86) PCT No.: PCT/US01/17481

§ 371 (c)(1),
(2), (4) Date: Feb. 5, 2003

(87) PCT Pub. No.: WO02/099860

PCT Pub. Date: Dec. 12, 2002

(65) Prior Publication Data

US 2003/0155584 A1 Aug. 21, 2003

(51) Int. Cl.[7] .......................... H01L 21/00; H01L 31/00

(52) U.S. Cl. .......................... 438/57; 438/93; 136/262

(58) Field of Search .................. 438/48–99, 479, 438/483; 136/243–265

(56) References Cited

U.S. PATENT DOCUMENTS

| | | |
|---|---|---|
| 4,614,961 A | 9/1986 | Khan et al. |
| 5,599,732 A | 2/1997 | Razeghi |
| 5,689,123 A | 11/1997 | Major et al. |
| 5,926,726 A | 7/1999 | Bour et al. |
| 5,930,656 A | 7/1999 | Furukawa et al. |
| 6,156,581 A | 12/2000 | Vaudo et al. |
| 6,362,494 B1 * | 3/2002 | Yagi et al. |

FOREIGN PATENT DOCUMENTS

| | | |
|---|---|---|
| JP | 05029220 | 5/1993 |
| JP | 05243153 | 9/1993 |
| JP | 08008186 | 1/1996 |

OTHER PUBLICATIONS

Kondow, Mashiko et al., GaInNAs: A Novel Material for Long–Wavelength–Range Laser Diodes with Excellent High–Temperature, Jpn. J. Appl. Phys. vol. 35, pp. 1273–1275, Part 1, No. 2B, Feb. 1996.

Hara, Yoshinori et al., Preparation of Nitrogen–Doped ZnSe Thin Films by RAdical–Assisted MOCVD, Materials Transactions, JIM, vol. 39, No. 3 (1998) pp. 427–431.

International Search Report, Mar. 11, 2002, PCT/US01/17481, Cited references listed below.

Patent Abstracts of Japan, vol. 2000, No. 4, Aug. 31, 2000, pub. No. 2000012902, Appl. No. 10338149, Yagi, Shigeru, Semiconductor Device, and Method and Apparatus of Manufacturing the Same.

EP 0 442 490 A; (Sumitomo Electric Industries), Kimoto, Tunenobu, Aug. 21, 1991,.

Patent Abstracts of Japan, vol. 1996, No. 5, May 31, 1996, pub. No. 08008186, Appl. No. 06159296, Sato, Junichi (Sony Corp.), Method of Forming Semiconductor Light Emitting Element Layer.

Sato, Michio et al., GaAsN Alloys: Growth and Optical Properties Sep. 28, 1992, Inst. Phys. Conf. Ser. No. 129; Chapt. 6, Int. Symp. AgAs and Related Compounds, Karuizawa 1992.

(List continued on next page.)

*Primary Examiner*—Savitri Mulpuri
(74) *Attorney, Agent, or Firm*—Paul J. White

(57) ABSTRACT

A method of combining group III elements with group V elements that incorporates at least nitrogen from a nitrogen halide for use in semiconductors and in particular semiconductors in photovoltaic cells.

23 Claims, 6 Drawing Sheets

OTHER PUBLICATIONS

Moto, A. et al. Hydrogen and Carbon Incorpoation in GaInNAs, Journal of Crystal Growth. North–Holland Publishing Co., Amsterdam, NL, vol. 221, No. I–4, Dec. 2000 pp. 485–490.

Kondow, Mashiko et al., Extremely Large N Content (up to 10%) in GaNAs Grown by Gas–Source Molecular Beam Epitaxy, Journal of Crystal Growth, North–Holland Publishing Co., Amsterdam, NL, vol. 164, Nol. 1, Jul. 1, 1996, pp. 175–179.

* cited by examiner

METHOD OF PREPARING NITROGEN CONTAINING SEMICONDUCTOR MATERIAL

CONTRACTUAL ORIGIN OF THE INVENTION

The United States Government has rights in this invention under Contract No. DE-AC36-99GO10337 between the United States Department of Energy and the National Renewal Energy Laboratory, a division of the Midwest Research Institute.

TECHNICAL FIELD

The invention relates generally to semiconductors and more particularly to the growth of nitrogen containing semiconductor material utilizing nitrogen halides as the nitrogen source.

BACKGROUND ART

Solar energy represents a vast source of relatively non-polluting, harnessable energy. It has been estimated that the amount of solar energy striking the United States each year is over 600 times greater than all the country's energy needs. Despite this abundance, solar energy has proven difficult to economically collect, store, and transport and thus has been relatively overlooked compared to the other more conventional energy sources, i.e., oil, gas and coal. However, as conventional energy sources become less abundant and their detrimental effect on the environment continue to escalate (acid rain, air particulates, green house gasses, etc), solar energy is becoming a more viable and attractive energy source.

One of the more effective ways of harnessing solar energy is through photovoltaic or solar cells, which convert solar energy directly into electrical energy. The energy conversion, solar to electrical, mediated by photovoltaic cells relies on semiconductor materials having a p-n junction with a surface exposed to the sun light. Sun light energy strikes the semiconductor and "frees" electrons in the surface material. This movement of electrons provides a current that can be used to power electrical devices. Presently, there is a need in the relevant art to have more cost effective and efficient photovoltaic cells. Cost effectiveness and the efficiency of photovoltaic cells are largely dependent on the cost of growing the semiconductor material and on the ability of the semiconductor material to efficiently convert solar energy to electrical energy.

The compounds used to produce compound semiconductors include elements listed in Group III and V or II and VI of the periodic table. A higher efficiency solar cell could be achieved if a high-quality material with a band gap of about 1 electron volt (eV) and a lattice technologies such as laser diodes that would benefit from the availability of semiconductor materials with a range of band gaps and lattice constants. Recently, it was shown that incorporating small amounts of nitrogen into GaAs results in a surprisingly large decrease in the material's bandgap without much effect on the lattice constant. Kondow et at., 1996, *Jpn. J. Appl. Phys.* 35:1273–1275.

In general, there are two techniques used to grow semiconductor material, molecular beam epitaxy (MBE) and metal-organic chemical vapor deposition (MOCVD). MME is a system that includes a deposition chamber maintained at low pressure, and has one or more effusion cells that contain material desired on the semiconductor wafer. The effusion cells are heated, which causes the atoms to evaporate out of the material and deposit onto the wafer located in the deposition chamber. Nitrogen has been successfully introduced into the MBE growth scheme by a radio-frequency plasma source which activates $N_2$. Unfortunately, although this is an effective means for growing nitrogen containing semiconductors, it is slow and as a result relatively cost prohibitive, especially in the case of solar cells which require a relatively large area of semiconductor growth. As such, MBE has not proven desirable for the growth of photovoltaic cells.

MOCVD allows for faster crystal growth and is hence more cost effective. It produces a semiconductor material, for example GaAs, by flowing trimethylgallium (TMGa) and arsine into a reaction chamber to form GaAs. Unfortunately, the addition of nitrogen to the semiconductor material using MOCVD has not resulted in high quality semiconductor material. In addition, the nitrogen sources, e.g., hydrazine and dimethylhydrazine (DMH), have proven to be difficult to obtain in high purity, expensive and/or potentially dangerous. Against this backdrop the present invention has been developed.

DISCLOSURE OF INVENTION

In one aspect, the invention provides a method for growing nitrogen containing III–V alloys that includes providing a substrate for forming an epilayer of III–V alloy and forming the epilayer on the substrate utilizing metal-organic chemical vapor deposition. The nitrogen source is a nitrogen halide.

In anther aspect, the invention provides a semiconductor for a solar cell comprising a substrate and an epilayer of nitrogen containing a III–V alloy. The nitrogen containing alloy results from a metal-organic chemical vapor deposition, where the nitrogen source is a nitrogen These and various other features as well as advantages that characterize the invention will be apparent from a reading of the following detailed description and a review of the associated figures.

BRIEF DESCRIPTION OF DRAWINGS

FIG. 1(a) illustrates the reduction of band gap with increasing nitrogen concentration as measured by x-ray diffraction and assuming that the epilayer is coherently strained.

FIG. 1(b) shows that measuring nitrogen concentration by x-ray diffraction or SIMS provides similar results.

FIG. 2 illustrates the incorporation of nitrogen from $NF_3$, hydrazine and DMH into GaAs relative to the starting nitrogen gas-phase concentration.

FIG. 3 illustrates the incorporation of nitrogen into GaAs as a function of the growth temperature using either $NF_3$, hydrazine or DMH as the nitrogen source.

FIG. 4 illustrates the measured thickness of the nitrogen containing epilayer as a function of growth temperature using either $NF_3$, or DM as the nitrogen source.

FIG. 5 illustrates the effect of $NF_3$ flow on the incorporation of nitrogen into gallium arsenide.

FIG. 6 illustrates the hole concentration in the nitrogen containing GaAs using $NF_3$ or DMH as the nitrogen source.

FIG. 7 illustrates the hole concentration in the nitrogen containing alloy as a function of nitrogen content using $NF_3$ and DMH as nitrogen sources.

FIG. 8 illustrates the carbon and hole concentrations for a nitrogen containing alloy having $NF_3$ as the nitrogen source.

FIG. 9 illustrates the correlation between hydrogen concentration and nitrogen concentration in GaAsN alloys for a variety of source gases and carrier gases.

BEST MODE FOR CARRYING OUT THE INENTION

Figure 1A:
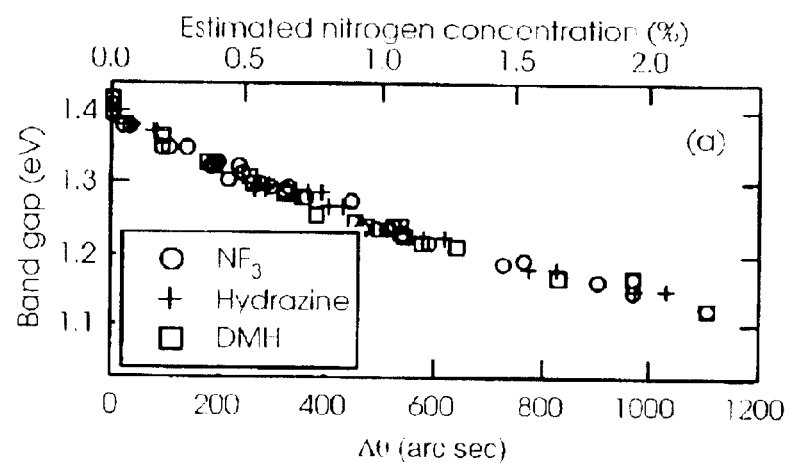
FIG. 1(a)

The invention involves the formation of III–V semiconductor materials having nitrogen incorporated at lattice sites within the material by utilizing a novel source of nitrogen, the nitrogen halides. Nitrogen containing group III based alloys show a very large bandgap bowing with nitrogen concentrations, as low as a few percent, lowering the bandgap by a significant containing semiconductors have a wide range of applications, including photovoltaic cells, long-wavelength lasers, and shortwave devices. The novel nitrogen halides of the invention make formation of the nitrogen containing crystals relatively inexpensive and safe, as compared to conventional formation methods.

The group III elements for use with this invention can be a combination of boron (B), aluminum (Al), gallium (Ga), and indium (In). The group V elements are nitrogen (N) alone or nitrogen in combination with arsenic (As), antimony (Sb), and/or phosphorous (P). The exact composition of any particular nitrogen containing semiconductor material are the relative concentrations of each of the group III and V elements, generally selected so as to substantially match the selected substrate's growing surface. Note, some level, below the level of forming lattice defects, of lattice mismatch is acceptable in these materials.

The nitrogen containing monocrystalline materials of the invention may also be doped with silicon (Si), carbon (C), tellurium (Te), beryllium (Be), magnesium (Mg), zinc (Zn), or selenium (Se) to control the particular semiconductors conductive properties.

The monocrystalline materials of the invention are formed by epitaxial growth on a monocrystalline substrate or wafer. Monocrystalline substrates can be selected from the group consisting of $Al_2O_3$, diamond, Si, Ge, InN, GaP, GaAsP, GaAs, InP, ZnO, ZnS and the like. Epitaxial, in relation to this invention, means the growth of the group III–V material on the surface of the substrate where the group III–V material is oriented by the lattice structure of the substrate. Note that the substrate and the nitrogen containing epilayer must be substantially lattice matched, i.e., the bond lengths of the substrate must substantially match the bond lengths of the particular nitrogen incorporating alloy. See Table 1. The following bond lengths have been shown to be equivalent: diamond 1.54 Å, SiC 1.88 Å, ZnO 1.99 Å, ZnS 2.34 Å, Si 2.35 Å, Ge 2.45 Å, and ZeSe 2.45 Å.

TABLE 1

| | Group III | | | | Group V | | | |
|---|---|---|---|---|---|---|---|---|
| Element | B | Al | Ga | In | N | P | As | Sb |
| Radius (Å) | 0.88 | 1.26 | 1.26 | 1.44 | 0.70 | 1.10 | 1.18 | 1.36 |

Epitaxial formation of the III–V semiconductor materials on the wafer substrate can be accomplished utilizing a chemical vapor deposition type procedure. In general, the materials involved in forming the semiconductor are mixed and reacted at high temperature in a deposition chamber to form a vapor. The atoms and molecules deposited on the wafer surface are built up to form a film.

The growth of the nitrogen containing film in a deposition chamber proceeds in stages—nucleation, which occurs as the first few atoms or molecules are deposited on the substrate's surface. The second stage includes the growth of the initial atoms into "islands" which eventually form into, during the third stage, a continuous film. With time, bulk is added to the film. The preferable chemical vapor deposition technique is metalorganic chemical vapor deposition (MOCVD). MOCVD utilizes two or three basic chemistries, halides, hydrides and metalorganics. The chemical vapors are brought to the substrate via a carrier gas, for example hydrogen. For example, in the formation of GaAsN, trimethylgallium or triethylgallium is metered into the reaction chamber along with arsine or other arsenic precursors and a nitrogen containing gas by the reaction:

$$Ga(CH_3)_3 + AsH_3 + NF_3 \rightarrow GaAs_{1-x}N_{x(s)} + \text{gaseous byproducts}$$

where ratios of the reactants are adjusted to obtain the desired compositions of the GaAsN solid.

The nitrogen source of the present invention is a nitrogen halide including, but not limited to, $NF_3$, $N_2F_4$, $NH_2Cl$, $NHCl_2$, $NCl_3$, $NHF_2$, $NH_2F$, and combinations thereof. The nitrogen halide is preferably $NF_3$. $NF_3$ is available as a high-purity gas readily available within the semiconductor industry. In this present work, the $NF_3$ was purchased from Air Products and Chemicals, Inc, Allentown, Pa., USA. Note that the nitrogen halides, because they are strong oxidizers, must be used at lower concentrations in the reducing environment of the MOCVD growth chamber. For example, when $NF_3$ is used as the nitrogen source, its concentration after mixing with a hydrogen carrier gas should be restricted to less than a few percent (see discussion of flammability limits in Example I).

In comparison, current nitrogen sources for incorporation into semiconductor materials include hydiazine and dimethylhydrazine (DMH). DMH is relatively expensive to purchase and has a much lower incorporation efficiency, as compared to $NF_3$, and has been shown to have a great deal of variation with regard to the quality of the liquid between any two batches, nitrogen incorporation efficiency, but may be unstable, i.e., explosive, as it is purified and therefore the chemical companies have been unwilling to purify it to a semiconductor grade. In addition, in both cases, hydrazine and DMH, the nitrogen containing alloy has been shown to be contaminated with carbon and hydrogen. As such, utilizing a nitrogen halide has the added benefit of removing carbon, hydrogen, and methyl groups from the nitrogen source and potentially causing a reduction in the contaminating materials within the semiconductor material.

With regard to one embodiment of the invention, GaAsN epilayers are grown by vertical flow, atmospheric-pressure, MOCVD on misoriented or singular (100) GaAs substrates. The GaAs wafer is rested on a graphite susceptor heated to between 550° C. to 700° C., and preferably between 550° C. and 600° C., by radio frequency power, or other alike heating technique. Triethylgallium or trimethylgallium is mixed with arsine clean (e.g., Megaclass grade) $NF_3$ in a flow of palladium-purified-hydrogen gas carrier. Other carrier gasses are envisioned to be within the scope of the present invention, including nitrogen and helium. $NF_3$ pressure may be from 0.01 to 2 torrs and is preferably from 0.01 to 1 torr, and more preferably about 0.1 torr and is dependent on the final nitrogen concentration required for the GaAsN or GaInAsN. Note that arsine pressure should be approximately between 0.01 and 5 torr, and is preferably approximately 0.2 torr. Final GaAsN epilayers should have a nitrogen concentration of from 0.1 to 3%.

A substrate for the GaAsN epilayer is a GaAs or Ge wafer, however, as noted above, other substrates may be used. Growth of the GaAsN layer utilizing MOCVD is continued until the film is an appropriate thickness for the desired device.

Other embodiments of the present invention include using other high grade nitrogen halide gasses at similar pressures to achieve the same or similar nitrogen concentrations in the semiconductor material. Potential nitrogen containing epilayers that may be formed utilizing a nitrogen halide as the nitrogen source include, but are not limited to, GaN, InN, AlN, GaInAsN, AlGaAsN, GaAsNSb, and AlGaAsPN.

Having generally described the invention, the same will be more readily understood by reference to the following examples, which are provided by way of illustration and are not intended as limiting.

EXAMPLES

Example 1

Addition of $NF_3$ to GaAs Reduces Alloys Band Gap and Lattice Constant

Materials and Methods

The GaAsN epilayers were grown by vertical-flow, atmospheric-pressure, metal organic chemical vapor deposition (MOCVD) on GaAs substrates misoriented 2° from the (100). The GaAs wafers rested on a graphite susceptor heated by radio frequency power. Arsine, timethylgallium (TMGa), triethylgallium (TEGa), u-dimethylhydrazine, and $NF_3$ were used in a 6 slm flow of palladium-purified-hydrogen carrier. The arsine pressure was approximately 0.2 torr for the majority of the runs, although in a few runs the pressure was higher.

Note that use of hydrazine, a rocket fuel, and DMH raise serious safety issues, where the combustion of either compound is strongly exothermic. As such both compounds must be used with extreme care. $NF_3$, on the other hand, is not a fuel, but rather an oxidizer. Oxidizers in the reducing environment provided by hydrogen mixed with arsine gas presents a potentially flammable environment. In $NF_3$, the upper flammability limit of $H_2$ is 90.6% and of silane is 95.3%. International Chemical Safety Cards, #1234 (available at http://hazard.com/msds/mf/cards/file/1234.html). To avoid accidental combustion inside of the growth system, the concentration of $NF_3$ after mixing with hydrogen was restricted to be less than 1% for all the following Examples.

The alloy layers were grown with an intended thickness of 1 $\mu$m on top of a thin Zn-doped $Ga_{0.5}In_{0.5}P$ layer. The thicknesses of each layer were measured by etching stripes of the GaAsN layer with an ammonia-hydrogen peroxide mixture, so as to stop at the $Ga_{0.5}In_{0.5}P$ layer, and profiling the step edge.

The rocking-mode, x-ray diffraction measurements utilized the (400) GaAs reflection of Cu radiation. The $\Delta\theta$ values are the difference between the Bragg angle (a characteristic angle at which x-rays reflect specularly from planes of atoms in a crystal) of the GaAs substrate and that of the epilayer.

Band gap was determined from wavelength dependence of the photocurrent generated by an aqueous-semiconductor junction formed on a BioRad Polaron Profiler. Geisz et al. (J Cryst Growth 195:401–408 (1998)).

Secondary Ion Mass Spectroscopy (SIMS) measurements were carried out using a Cameca IMS-5F instrument and a $Cs^+$ beam. A nitrogen-implanted standard was used to quantify the concentration of nitrogen, measured from the AsN ion.

Figure 1B:
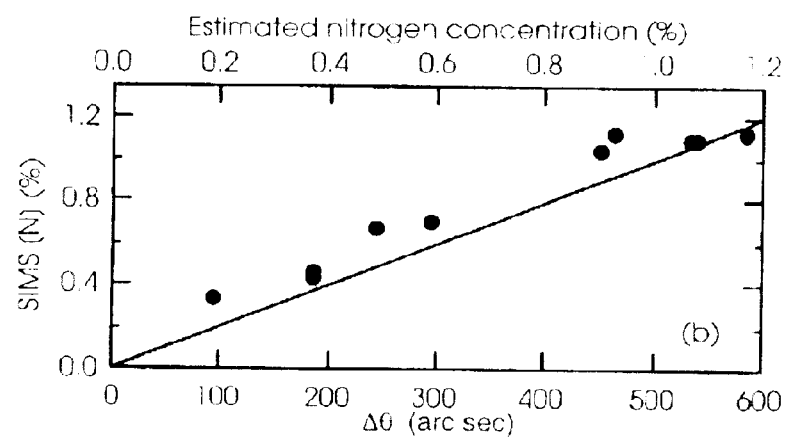
FIG. 1(b)

Results and Discussion:

Addition of nitrogen to GaAs has been shown to reduce both the band gap and lattice constant of the resultant alloy. Kondow et al. (J Appl Phys 35:1273–1275 (1996)). As shown in FIG. 1(a), $NF_3$ is an excellent nitrogen source for incorporation into the resultant GaAsN alloy, as indicated by a shift in the alloy's Bragg angle ($\theta$), i.e., a reduction in the lattice constant, in correlation with a decrease in the band gap. These $\theta$ and band gap results are similar to the results from other well known nitrogen sources, hydrazine and u-dimethylhydrazine (DMH). Note, as illustrated in FIG. 1(b), that the nitrogen concentration of the resultant alloys were confirmed using SIMS, indicating that the x-ray diffraction data in FIG. 1(a), and other Examples herein, can be used as an indication of the nitrogen content of the GaAsN samples.

This data illustrates that $NF_3$ represents a nitrogen source for nitrogen containing alloys, and in particular for GaAsN.

Example 2

$NF_3$ is a More Efficient Nitrogen Source Than DMH

Materials and Methods:

MOCVD nitrogen incorporation efficiency was determined by varying the N/As ratio (changing nitrogen flow), while maintaining a constant growth temperature of 550° C., growth rate of 4 $\mu$m/hr, and trimethylgallium as gallium source.

Figure 2:
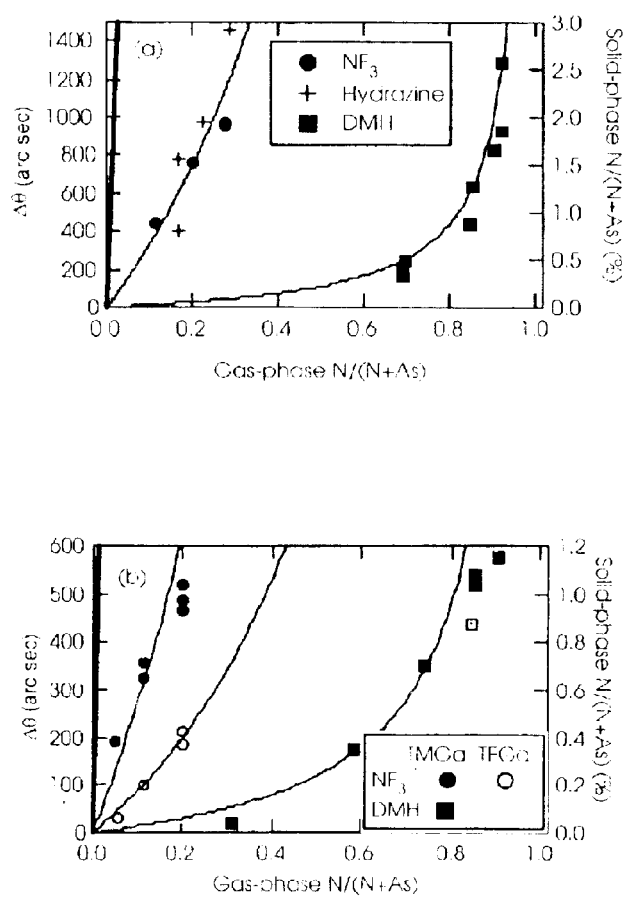
FIG. 2.

Results and Discussion:

Nitrogen incorporates into GaAs by MOCVD much more efficiently from $NF_3$ than from DMH, as shown in FIG. 2. In fact, $NF_3$ is incorporated into the GaAs with about the same efficiency as using hydrazine as the nitrogen source. Under these growth conditions, having constant arsine flow, the incorporation of nitrogen in GaAs is approximately linear with $NF_3/(NF_3+As)$ or the concentration of DMH, respectively.

Note that the line at the left side of FIG. 2 shows the data expected if the N/As ratio in the film were the same as in the gas phase, demonstrating that the incorporation efficiency of nitrogen in GaAs by MOCVD is low, regardless of the nitrogen source.

This data illustrates that although nitrogen incorporation into GaAs is low by MOCVD, $NF_3$ is an excellent source of nitrogen as it exhibits a similar efficiency as hydrazine and of much greater efficiency than DMH. In fact, $NF_3$ is a preferable nitrogen source to hydrazine as hydrazine is highly unstable and explosive.

Example 3

Nitrogen Incorporation into Gallium Arsenide is Temperature Dependent

Materials and Methods:

Epilayer growth conditions were essentially as described in Example 1. A growth rate of 4 $\mu$m/hr was used for temperatures that varied from between 550° C. to 700° C. Nitrogen incorporation was as described in Example 1. To measure growth rate of the nitrogen incorporating alloys, all alloys were calibrated by measuring the thickness of a GaAs epilayer. This was completed using TMGa, and then again for TEGa. The TMGa and TEGa flows and the times of the growths were adjusted to grow 1 $\mu$m of material, based on the calibration runs.

Figure 5:
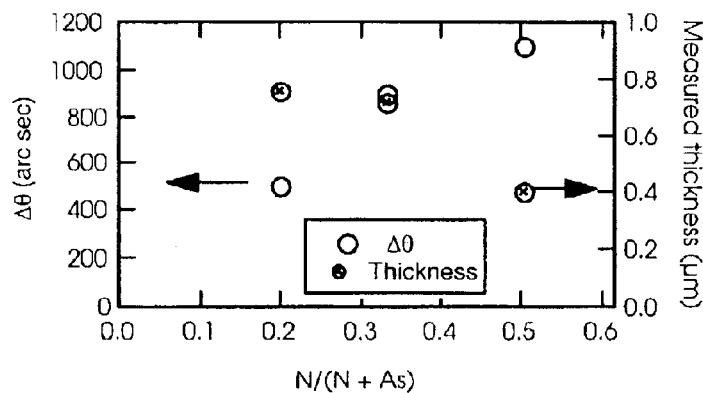
FIG. 5.
Figure 6:
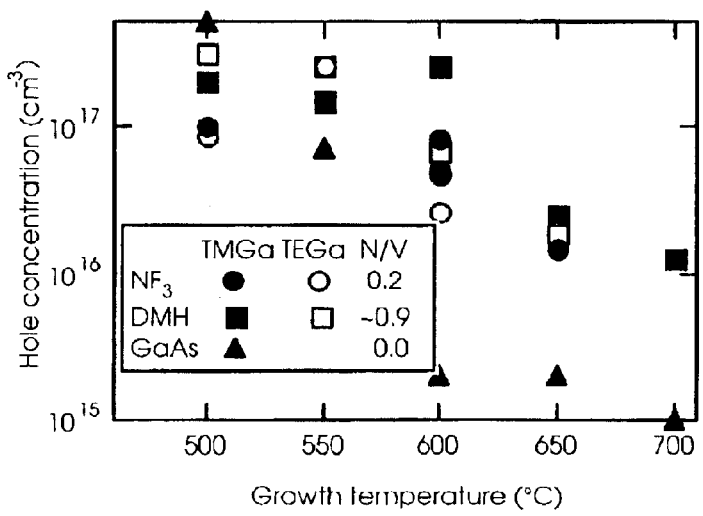
FIG. 6.

With regard to $NF_3$ flow in FIG. 5, a flow of between 0.5 and 2 sccm was used and the growth rate was 2 $\mu$m/hr at 550° C.

Figure 3:
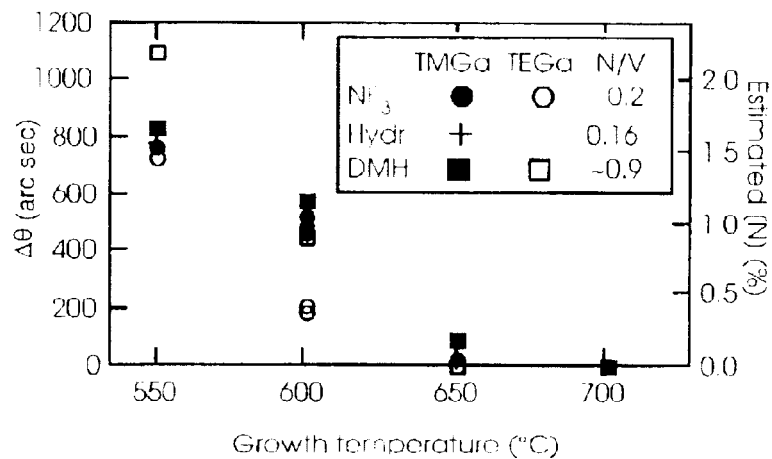
FIG. 3.

Results and Discussion:

FIG. 3 illustrates the incorporation of nitrogen as a function of the growth temperature for three nitrogen precursors, $NF_3$, hydrazine and DMH, and two gallium precursors, TMGa and TEGa. For both TMGa and TEGa, the nitrogen incorporation decreased with increasing growth temperature. Highest nitrogen incorporation was found at 550° C. growth temperature as compared to 700° C., where nitrogen incorporation was negligible.

Figure 4:
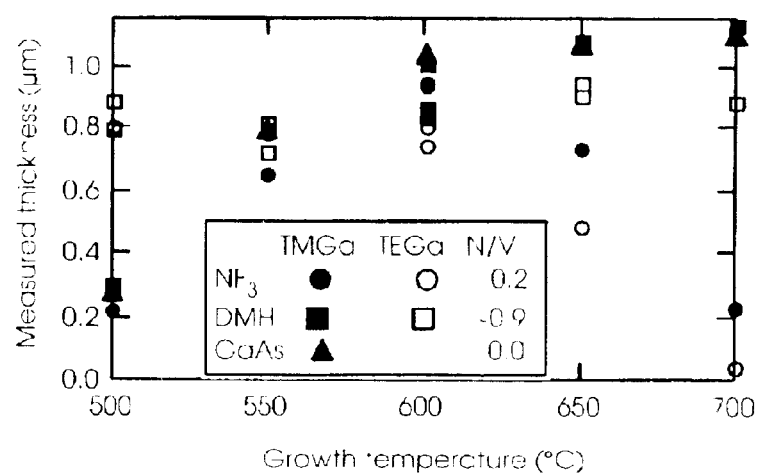
FIG. 4.

FIG. 4 illustrates the observed growth rate of the nitrogen containing alloys as a function of growth temperature. At low growth temperatures, the observed growth rate is significantly decreased when TMGa is used. This is likely the result of incomplete decomposition of the TMGa. In contrast, TEGa is known to decompose at a lower temperature, as it shows relatively little change in growth rate at 500° C. At higher growth temperatures, the growth rate decreases when $NF_3$ is used as the nitrogen source, which is likely due to the formation of gallium fluorides in competition with GaAs.

Finally, FIG. 5 provides evidence of reduced growth rates at 550° C. when higher $NF_3$ flow rates are used. As such, growth rate may become unpredictable for high $NF_3$ flows, even at low growth temperatures.

Example 4

GaAsN Hole Concentration Grown with $NF_3$ as Nitrogen Source Shows Improved or Similar Hole Concentration Materials and Methods:

GaAsN epilayer growth was as essentially described in Example 1. Background hole concentration were measured by capacitance-voltage profiling using a Bio-Rad Polaron profiler. The hole concentration was often observed to be smaller near the surface, possibly because of hydrogen passivation of acceptors near the surface, requiring that hole concentrations be measured at a bias voltage of –2V.

As briefly discussed above, SIMS measurements were carried out using a Cameca IMS-5F instrument. The primary-ion beam of Cs+ was purified by a mass filter, and had an impact energy of 14.5 keV and a current of 50 nA; and was incident at 25° from surface normal. Negative secondary ions generated from the sample were accelerated normal to its surface and were detected at 4.5 kev. The working pressure was $2 \times 10^{-10}$ torr. Secondary ions were counted by an electron multiplier detector. The concentration of carbon and hydrogen were calculated from the relative sensitivity factors. Wilson et al. (eds Wiley (1997)).

Figure 7:
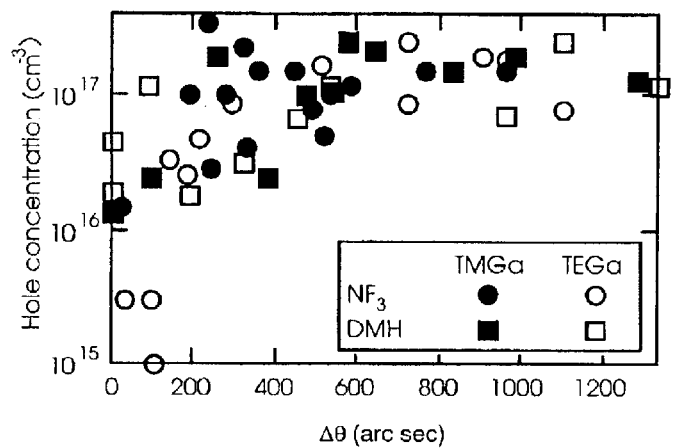
FIG. 7.

Results and Discussion:

As a preliminary point, hole concentrations are reduced for growth at high temperatures regardless of the nitrogen source or nitrogen containing alloy. (FIG. 7). GaAs alloy, having no nitrogen, provides a reference for the nitrogen containing alloys and showed low hole concentrations such that the alloy was fully depleted at higher temperatures. With regard to nitrogen precursors, hole concentrations are reduced for growth at high temperatures and likely reflects the decreased incorporation of both carbon and nitrogen into the alloys.

Figure 8:
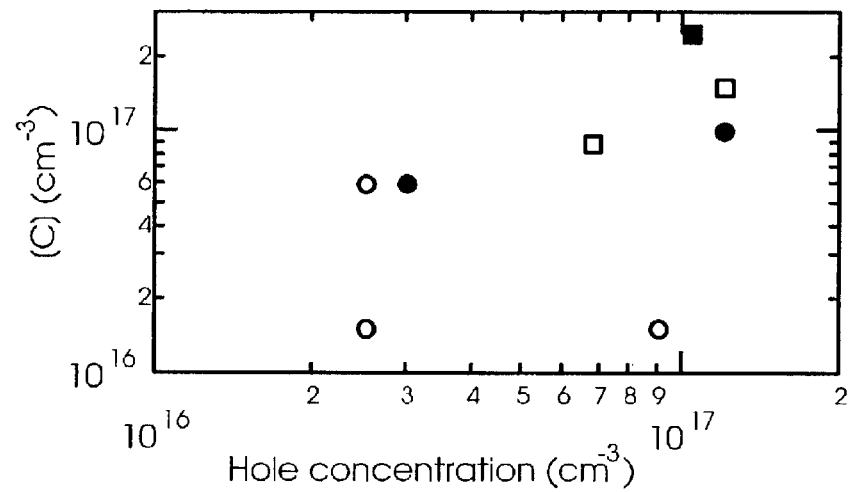
FIG. 8.
Figure 9:
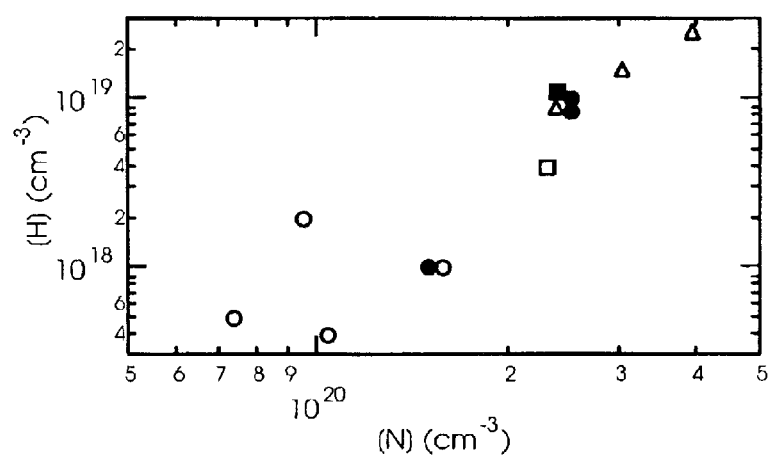
FIG. 9.

FIG. 7 illustrates that the hole concentration increases to the $1-3 \times 10^{17}$ cm$^{-1}$ range for samples with more than about 1% nitrogen from either $NF_3$ or DMH. Note that the low hole concentrations measured for low-N GaAsN grown from $NF_3$ and TEGa imply that this combination of precursors may provide some advantage, but only for low nitrogen concentration. Also note that carbon contamination may explain much of the observed hole concentration data. As shown in FIG. 8, using TEGa reduces the carbon contamination, but has little effect on the hole concentration. Finally, as illustrated in FIG. 9, the hydrogen level in GaAsN, regardless of nitrogen source, is a function of the nitrogen level, i.e., the hydrogen level in the nitrogen containing alloy increases with nitrogen content, which corresponds to data implies that the N—H bond is formed during deposition, and is not simply a remnant of the N—H bond in DMH. It is also noted that replacement of most of the hydrogen carrier during the MOCVD did not effect the hydrogen incorporation significantly, implying that the gallium or arsine source is an efficient source of hydrogen.

These results suggest that the strength of the N—H bond promotes the incorporation of hydrogen and that it is very difficult to avoid incorporation of hydrogen into the growing material if there is any hydrogen in the growth system. It is believed that a reduction in hydrogen concentration may lead to a higher quality semiconductor material and that $NF_3$ and DMH are similar from the stand point of hydrogen incorporation into the alloy, although $NF_3$ has the potential of introducing fewer hydrogen atoms simply from the stand point that it has no hydrogen atoms.

Example 5

Halogenated Nitrides are Energetically Favorable Precursors

Materials and Methods:

All thermochemical data was taken from the NIST-JANAF Thermochemical Tables published in 1998, which take into account temperature effects. Gibbs free energy calculations were determined using the following reactions:

$NF_3(g)+In(CH_3)_3(g) \rightarrow 3CH_3F+InN(s)$           Reaction 1:

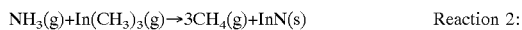

$NH_3(g)+In(CH_3)_3(g) \rightarrow 3CH_4(g)+InN(s)$           Reaction 2:

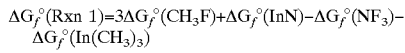

$\Delta G_f^\circ(\text{Rxn 1})=3\Delta G_f^\circ(CH_3F)+\Delta G_f^\circ(InN)-\Delta G_f^\circ(NF_3)-\Delta G_f^\circ(In(CH_3)_3)$

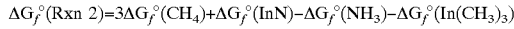

$\Delta G_f^\circ(\text{Rxn 2})=3\Delta G_f^\circ(CH_4)+\Delta G_f^\circ(InN)-\Delta G_f^\circ(NH_3)-\Delta G_f^\circ(In(CH_3)_3)$

$\Delta G_f^\circ(\text{net})=\Delta G_f^\circ(\text{Rxn 1})-\Delta G_f^\circ(\text{Rxn 2})$

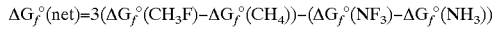

$\Delta G_f^\circ(\text{net})=3(\Delta G_f^\circ(CH_3F)-\Delta G_f^\circ(CH_4))-(\Delta G_f^\circ(NF_3)-\Delta G_f^\circ(NH_3))$ Results and Discussion:

The difference in Gibbs free energy of formation for the formation of a Group IIIa nitride from a metal organic precursor and $NH_3$ and $NF_3$ as the nitrogen sources were computed to illustrate the advantage of a halogen based nitrogen precursor. The results in Table 2 show that the addition of halogenated nitrides as precursor have a significant higher driving force to form nitrides than the use of hydrogen-nitrogen compounds. This thermodynamic data again illustrates the usefulness of $NF_3$, as well as other halogenated nitrides, as a potentially better nitrogen source for semiconductor alloys from a theoretical aspect.

TABLE 2

| Temp. (K) | $\Delta G_f°$ (CH$_3$F) | $\Delta G_f°$ (CH$_4$) | $\Delta G_f°$ (NF$_3$) | $\Delta G_f°$ (NH$_3$) | 3*$\Delta G_f°$ Carbon species | $\Delta G_f°$ in nitrogen species | $\Delta G_f°$ (net) |
|---|---|---|---|---|---|---|---|
| 300 | −210.210 | −50.618 | −90.324 | −16.183 | −478.78 | −74.141 | −404.635 |
| 400 | −201.716 | −42.054 | −76.307 | −5.941 | −478.99 | −70.366 | −408.62 |
| 500 | −192.515 | −32.741 | −62.224 | 4.800 | −479.32 | −67.024 | −412.298 |
| 600 | −182.822 | −22.887 | −48.165 | 15.879 | −479.81 | −64.044 | −415.761 |
| 700 | −172.783 | −12.643 | −34.164 | 27.190 | −480.42 | −61.354 | −419.066 |
| 800 | −162.500 | −2.115 | −20.234 | 38.662 | −481.16 | −58.896 | −422.259 |
| 900 | −152.045 | 8.616 | −6.375 | 50.247 | −481.98 | −56.622 | −425.361 |
| 1000 | −141.470 | 19.492 | 7.416 | 61.910 | −482.89 | −54.494 | −428.392 |

What is claimed is:

1. A method for producing an epilayer of a group III element, nitrogen, and a group V element other than nitrogen, the method comprising:

providing a substrate and forming an epilayer on said substrate, said epilayer comprising a group III element, nitrogen and a group V element other than nitrogen, wherein metal organic chemical vapor deposition is used to deposit at least one of said group II and group V elements and wherein said nitrogen is from a nitrogen halide source, wherein the final nitrogen concentration of the epilayer is from about 0.1% to about 3%.

2. The method of claim 1 wherein the nitrogen halide comprises NF$_3$, N$_2$F$_4$, NH$_2$Cl, NHCl$_2$, NCl$_3$, or mixtures thereof.

3. The method of claim 2 wherein the nitrogen halide is NF$_3$.

4. The method of claim 1 wherein the substrate comprises GaAs, InP, GaP, or mixtures thereof.

5. The method of claim 1 wherein the substrate comprises GaAs.

6. The method of claim 1 further comprising controlling the conductive properties and carrier concentration in the epilayer by adding a dopant, wherein the dopant comprises silicon, carbon, tellurium, beryllium, magnesium, zinc, selenium, or mixtures thereof.

7. The method of claim 1 wherein the epilayer comprises GaAsN, GaInAsN, GaAsNSb, GaPN, GaAsPN or mixtures thereof.

8. The method of claim 1 wherein the metal organic chemical vapor deposition is performed at a temperature of about 500° C. to about 700° C.

9. The method of claim 1 wherein the metal organic chemical vapor deposition is performed at a temperature of about 550° C. to about 650° C.

10. The method of claim 1 wherein the metal organic chemical vapor deposition is performed with a nitrogen halide gas used at a pressure of from 0.01 to 2 torr.

11. The method of claim 1 wherein the metal organic chemical vapor deposition is performed with a nitrogen halide gas used at a pressure of from 0.01 to 1 torr.

12. The method of claim 1 wherein the nitrogen halide is mixed with a carrier.

13. The method of claim 12 wherein the carrier is an inert gas.

14. The method of claim 1 wherein the group III element of the III–V alloy comprises gallium.

15. The method of claim 1 further comprising incorporating the nitrogen containing epilayer into a solar cell.

16. A nitride-based semiconductor for a solar cell comprising:

a substrate; and an epilayer comprising a group III element, nitrogen, and a group V element other than nitrogen, wherein metal organic chemical vapor deposition is used to deposit at least one of said group III and group V elements and wherein said nitrogen is from a nitrogen halide source, wherein the nitrogen concentration of the epilayer is from about 0.1% to about 3%.

17. A The solar cell of claim 16 wherein the nitrogen halide comprises NF$_3$, N$_2$F$_4$, NH$_2$Cl, NHCl$_2$, NCl$_3$, or mixtures thereof.

18. The solar cell of claim 17 wherein the nitrogen halide comprises NF$_3$.

19. The solar cell of claim 16 wherein the substrate comprises GaAs, InP, GaP, or mixtures thereof.

20. The solar cell of claim 16 further comprising controlling the conductive properties and carrier concentration in the epilayer by adding a dopant, wherein the dopant comprises silicon, carbon, tellurium, beryllium, magnesium, zinc, selenium, or mixtures thereof.

21. The solar cell of claim 16 wherein the epilayer of III–V alloy comprises GaAsN, GaInAsN, GaAsNSb, and mixtures thereof.

22. The solar cell of claim 16 wherein the group III element of the epilayer comprises gallium.

23. The solar cell of claim 16 wherein the group III element of the epilayer comprises indium.

* * * * *